United States Patent [19]
Tamatsuka et al.

[11] Patent Number: 6,162,708
[45] Date of Patent: Dec. 19, 2000

[54] METHOD FOR PRODUCING AN EPITAXIAL SILICON SINGLE CRYSTAL WAFER AND THE EPITAXIAL SILICON SINGLE CRYSTAL WAFER

[75] Inventors: Masaro Tamatsuka; Ken Aihara; Tomosuke Yoshida, all of Gunma-ken, Japan

[73] Assignee: Shin-Etsu Handotai Co., Ltd., Tokyo, Japan

[21] Appl. No.: 09/310,045

[22] Filed: May 11, 1999

[30] Foreign Application Priority Data

May 22, 1998 [JP] Japan .................................. 10-158322

[51] Int. Cl.$^7$ ...................................................... H01L 21/20
[52] U.S. Cl. .......................... 438/503; 438/471; 438/502; 438/916; 148/33
[58] Field of Search ..................................... 438/471, 477, 438/502, 503, 505, 916, 918, 974; 148/33; 117/13, 19, 20

[56] References Cited

U.S. PATENT DOCUMENTS 5,744,380  4/1998  Uemura et al. .

FOREIGN PATENT DOCUMENTS

| 0170788 A1 | 2/1986 | European Pat. Off. . |
| 0829559 A1 | 3/1998 | European Pat. Off. . |
| 60-251190 | 12/1985 | Japan . |
| 62-251190 | 12/1985 | Japan .............................. C30B 15/04 |
| 5-121319 | 5/1993 | Japan . |

OTHER PUBLICATIONS

F. Shimura et al., "Nitrogen effect on oxygen precipitation in Czochralski silicon", Appl. Phys. Lett. 48 (3) pp. 224–226, Jan. 1986.

Shimura, F. and R.S. Hockett, "Nitrogen Effect on Oxygen Precipitation in Czochralski Silicon," 1986 American Institute of Physics, App. Phys. Lett. 48 (3), Jan. 20, 1986, pp. 224–226.

Abe, Takao and Hiroshi Takeno, "Dynamic Behavior of Intrinsic Point Defects in FX an CZ Silicon Crystals," 1992 Materials Research Society, pp. 3–13. No Month.

Watanabe, et al., "Controlled oxygen doping in silicon", Japanese Journal of Applied Physics, Supplements, vol. 22, 1983, pp. 185–189. No Month.

*Primary Examiner*—Charles Bowers
*Assistant Examiner*—Keith Christianson
*Attorney, Agent, or Firm*—Hogan & Hartson, LLP

[57] ABSTRACT

There is disclosed a method for producing an epitaxial silicon single crystal wafer comprising the steps of growing a silicon single crystal ingot wherein nitrogen is doped by Czochralski method, slicing the silicon single crystal ingot to provide a silicon single crystal wafer, and forming an epitaxial layer in the surface layer portion of the silicon single crystal wafer. There can be manufactured easily and in high productivity an epitaxial silicon monocrystal wafer which has high gettering capability when a substrate having a low boron concentration is used, a low concentration of heavy metal impurity, and an excellent crystallinity.

24 Claims, 5 Drawing Sheets

METHOD FOR PRODUCING AN EPITAXIAL SILICON SINGLE CRYSTAL WAFER AND THE EPITAXIAL SILICON SINGLE CRYSTAL WAFER

BACKGROUND OF THE INVENTION

1. Field of the Invention

The present invention relates to a method for producing an epitaxial silicon single crystal wafer, and an epitaxial silicon single crystal wafer having low concentration of heavy metal impurity and excellent crystallinity.

2. Description of the Related Art

An epitaxial silicon single crystal wafer has been used since a long time ago as a wafer for producing a discrete semiconductor or a bipolar IC. It has also been used for MOS LSI since it hardly causes software error and has excellent latch up property, and therefore has been used for a microprocessor unit or as a flash memory device. Furthermore, in order to reduce reliability failure of DRAM due to grown-in defects, needs for the epitaxial silicon single crystal wafer is gradually increasing.

When heavy metal impurity is present in the epitaxial silicon single crystal wafer used for a semiconductor device, characteristics of the semiconductor device are degraded. Particularly, cleanliness which is required for an advanced device is considered to be a concentration of heavy metal impurity of $1 \times 10^9$ atoms/cm$^2$ or less. Accordingly, heavy metal impurity has to be reduced as much as possible.

There has been increased importance of gettering technology which is one of techniques for reducing such a heavy metal impurity. Conventionally, a substrate having high boron concentration (for example, $3 \times 10^{18}$ atoms/cm$^3$ or more, 0.02Ω·cm or less) which is excellent in gettering effect has been used for producing an epitaxial silicon single crystal wafer. Accordingly, high device yield has been achieved in the epitaxial silicon single crystal wafer compared to the silicon single crystal wafer having general (ordinary or medium) resistivity produced by Czochralski method.

However, along with a recent tendency to use a substrate having lower boron concentration than that of the conventional substrate as an epitaxial silicon single crystal wafer for CMOS device, there is caused a problem of lower gettering capability compared to a substrate having high boron concentration. Moreover, the problem of low gettering capability is caused even in the substrate having high boron concentration depending on the concentration.

In the case of a high boron concentration substrate having a resistivity less than 0.1Ω·cm, there are problems that there is easily caused auto-doping wherein impurity vaporized from the substrate during epitaxial growth is incorporated again into the epitaxial layer and impurity is incorporated from the surface of the substrate to the epitaxial layer by solid phase out-diffusion. Since the resistivity of the epitaxial layer may be changed as a result of auto-doping, it is necessary to take measures such as CVD coating of the substrate with SiO$_2$, which may lead to low productivity and high production cost.

SUMMARY OF THE INVENTION

The present invention has been accomplished to solve the above-mentioned problems, and a main object of the present invention is to provide a method of producing easily and in high productivity a epitaxial silicon single crystal wafer wherein high gettering capability can be maintained even when using the substrate having low boron concentration, low concentration of heavy metal impurity can be achieved, and crystallinity is excellent.

To achieve the above mentioned object, the present invention provides a method for producing an epitaxial silicon single crystal wafer characterized in that a silicon single crystal ingot in which nitrogen is doped is grown by Czochralski method, and the resultant silicon single crystal ingot is sliced to produce a silicon single crystal wafer, and then an epitaxial layer is formed in the surface layer portion of the resultant silicon single crystal wafer.

As described above, when the epitaxial silicon single crystal wafer is produced by the method wherein a silicon single crystal ingot in which nitrogen is doped is grown by Czochralski method, and the resultant silicon single crystal ingot is sliced to produce a silicon single crystal wafer, and then an epitaxial layer is formed in the surface layer portion of the resultant silicon single crystal wafer, oxygen precipitation can be accelerated in a bulk portion of silicon single crystal wafer because of presence of nitrogen, and thereby, there can be obtained the epitaxial silicon single crystal wafer wherein high gettering capability can be maintained even when using the substrate having low boron concentration and low concentration of heavy metal impurity can be achieved.

It is preferable that a concentration of nitrogen doped in the single crystal ingot is in the range of $1 \times 10^{10}$ to $5 \times 10^{15}$ atoms/cm$^3$ when the silicon single crystal in which nitrogen is doped by Czochralski method is grown.

Because, the concentration of $1 \times 10^{10}$ or more is preferable in order to sufficiently suppress the growth of crystal defects in the silicon wafer with nitrogen, and the concentration of $5 \times 10^{15}$ atoms/cm$^3$ or less is preferable so as not to prevent crystallization of the silicon single crystal in Czochralski method.

It is further preferable that a concentration of nitrogen doped in the single crystal ingot is in the range of $1 \times 10^{13}$ to $1 \times 10^{14}$ atoms/cm$^3$ when the silicon single crystal in which nitrogen is doped is grown by Czochralski method.

Because, when the nitrogen concentration is $1 \times 10^{13}$ atoms/cm$^3$ or more, nuclei of oxygen precipitation which are stable at a high temperature can be surely formed in the as-grown silicon single crystal immediately after grown, so that the nuclei of oxygen precipitation are not eliminated and there can be surely produced an epitaxial wafer wherein the density of oxide precipitates after the heat treatment for oxygen precipitation following to epitaxial growth is $1 \times 10^8$ number/cm$^3$ or more, even if the epitaxial growth is performed at a high temperature, for example, more than 1000° C.

When the nitrogen concentration is $1 \times 10^{14}$ atoms/cm$^3$ or less, formation of crystal defects such as stacking fault (SF) in the epitaxial layer is significantly suppressed.

As used in the present invention, the heat treatment for oxygen precipitation means, for example, a heat treatment at 800° C. for 4 hours in a nitrogen atmosphere followed by a heat treatment at 1000° C. for 16 hours in an oxygen atmosphere.

It is preferable that interstitial oxygen concentration contained in the single crystal ingot is 18 ppma or less (JEIDA: Japan Electronics Industry Development Association).

When the oxygen concentration is low as above, formation of crystal defects in the silicon wafer can be suppressed, and formation of oxide precipitates in the surface layer can be prevented, and thus the crystallinity of the epitaxial layer is hardly deteriorated. Furthermore, since oxygen precipitation is accelerated in a bulk portion due to the presence of nitrogen, sufficiently large gettering effect can be achieved in low oxygen concentration.

It is preferable that the silicon single crystal wafer is subjected to the heat treatment of from 900° C. to a melting point of silicon before the epitaxial layer is formed in the surface layer portion of the silicon single crystal wafer.

When the silicon single crystal wafer is subjected to the heat treatment of from 900° C. to a melting point of silicon before the epitaxial layer is formed as described above, nitrogen or oxygen in the surface layer of the silicon single crystal wafer can be out-diffused, and the crystal defects in the surface layer of the silicon single crystal wafer can be significantly decreased, so that the crystallinity of the epitaxial layer is prevented from being deteriorated. In that case, the nuclei of precipitation are not dissolved, when the high temperature heat treatment for forming the epitaxial layer is performed. Accordingly, sufficient gettering effect can be achieved.

It is preferable that the above-mentioned heat treatment is performed in an atmosphere of hydrogen, inert gas or a mixed atmosphere thereof, for at least 30 seconds.

When the heat treatment is performed in an atmosphere of hydrogen, inert gas or a mixed atmosphere thereof, the nuclei of oxidation induced stacking fault (OSF) is not grown, a film is not formed on the wafer, oxygen and nitrogen in the surface layer of the wafer can be surely out-diffused, and the crystal defects on the surface layer of the wafer can be decreased. The heat treatment for at least 30 seconds makes the effect of the heat treatment sufficient.

It is preferable that the resistivity of the silicon single crystal wafer is 0.1Ω·cm or more.

According to the present invention, it is possible to produce an epitaxial wafer having low concentration of the heavy metal impurity owing to high gettering effect even when the silicon single crystal having high resistivity and low boron concentration is used. Accordingly, the method of the present invention can be applied to production of the epitaxial silicon single crystal wafer which is used for a substrate for CMOS device with a high resistivity or the like. Furthermore, when the boron concentration is low, auto-doping is hardly caused, so that the treatment for preventing auto-doping is not necessary, and thereby productivity and cost performance can be improved.

The silicon single crystal wafer produced according to the method of the present invention is, for example an epitaxial silicon single crystal wafer obtained by forming an epitaxial layer on a surface layer portion of the silicon single crystal wafer manufactured by slicing a silicon single crystal ingot grown by Czochralski method with doping nitrogen.

The silicon single crystal wafer has preferably a nitrogen concentration of $1 \times 10^{10}$ to $5 \times 10^{15}$ atoms/cm$^3$, or more preferably $1 \times 10^{13}$ to $1 \times 10^{14}$ atoms/cm$^3$.

As described above, when the epitaxial wafer is produced by forming an epitaxial layer on the silicon single crystal wafer wherein the nitrogen concentration of the silicon single crystal wafer is appropriately controlled, the crystallinity of the epitaxial layer can be further improved.

When the nitrogen concentration of the silicon single crystal wafer is $1 \times 10^{13}$ to $1 \times 10^{14}$ atoms/cm$^3$, it is possible to decrease the defect density on the surface of the epitaxial layer to 0.3 number/cm$^2$ or less.

As described above, in the epitaxial silicon single crystal wafer of the present invention, when nitrogen is doped in an adequate amount, the defect density on the surface of the epitaxial layer can be surely decreased to a very low level as 0.3 number/cm$^2$. When the epitaxial wafer is used for production of a device, degradation of an oxide dielectric breakdown voltage or the like is hardly caused due to such a high crystallinity of the epitaxial layer, so that device yield can be significantly improved.

The oxygen concentration of the silicon single crystal wafer can be 18 ppma or less.

When the epitaxial wafer is the silicon single crystal wafer wherein the epitaxial layer is formed on the surface thereof, the crystallinity of the epitaxial layer is hardly deteriorated by formation of oxide precipitates in the surface layer. In the bulk portion, oxygen precipitation is accelerated by the presence of nitrogen, so that gettering effect can be maintained even in low oxygen concentration.

It is preferable that the above-mentioned silicon single crystal wafer contains the nuclei of the oxygen precipitation in the as-grown silicon single crystal ingot in such an amount that the density of oxide precipitates formed by the heat treatment for oxygen precipitation after epitaxial growth may be $1 \times 10^8$ number/cm$^3$ or more.

"As-grown" herein means a state wherein no heat treatment is performed after the silicon single crystal ingot is pulled, or the condition wherein only the donor annihilation heat treatment which is generally performed is performed.

In production of the epitaxial silicon single crystal wafer of the present invention, the silicon single crystal ingot is grown with doping nitrogen, and therefore the silicon single crystal ingot immediately after being grown, namely the as-grown silicon single crystal has a lot of nuclei of oxygen precipitation which are stable at high temperature. Accordingly, even when the epitaxial growth is performed at a high temperature, the nuclei of the oxygen precipitation are not eliminated, and it is possible to obtain a high gettering effect that the density of oxide precipitates is $1 \times 10^8$ number/cm$^3$ or more after the heat treatment for the precipitation following to the epitaxial growth.

It is preferable that the silicon single crystal wafer is subjected to the heat treatment at a temperature in the range of from 900° C. to a melting point of silicon before the epitaxial layer is formed.

When the heat treatment is performed before the epitaxial growth, generation of defects such as stacking faults (SF) formed on the epitaxial layer can be suppressed. Accordingly, the epitaxial silicon single crystal wafer wherein the epitaxial layer is formed in the surface layer of the silicon single crystal wafer contains very few crystal defects in the surface layer portion, and has a high gettering effect in the bulk portion, so that good crystallinity and the low concentration heavy metal impurity can be achieved in the surface layer of the epitaxial silicon single crystal wafer.

It is preferable that the above-mentioned silicon single crystal wafer is subjected to the heat treatment in an atmosphere of hydrogen, inert gas or a mixed atmosphere thereof, for at least 30 seconds before the formation of the epitaxial layer on the surface layer portion.

When the wafer is subjected to a heat treatment in such an atmosphere, the surface of the wafer is not adversely affected by the heat treatment. For example, neither OSF nor a film is formed thereon. The heat treatment time can be short as at least 30 seconds or more, so that high productivity can be achieved.

In the silicon single crystal wafer after the heat treatment performed before epitaxial growth in the surface layer portion, the density of the defect having a size of 0.135 μm or more in the surface layer can be 0.12 number/cm$^2$ or less, and the density of the oxide precipitates generated by the heat treatment for oxygen precipitation in the bulk portion can be 1×10$^8$ number/cm$^2$ or more.

As described above, in the epitaxial silicon single crystal wafer of the present invention, the density of the defect having a size of 0.135 μm or more is low as 0.12 number/cm$^2$ or less in the surface layer portion. In the bulk portion thereof, the density of the oxide precipitates is high as 1×10$^8$ number/cm$^2$ or more, so that the crystallinity in the epitaxial layer in the surface layer portion of the epitaxial silicon single crystal wafer is very excellent, and the concentration of heavy metal impurity therein is quite low.

In the epitaxial silicon single crystal wafer, the resistivity of the silicon single crystal wafer can be 0.1Ω·cm or more. Accordingly, the wafer can be used as an epitaxial silicon single crystal wafer for recently used CMOS device, and the productivity thereof is high, since the problem of auto-doping hardly occurs.

As described above, according to the present invention, The silicon wafer in which nitrogen is doped is used as a substrate for epitaxial silicon single crystal wafer. Accordingly, the gettering effect can be improved in the epitaxial silicon single crystal wafer wherein the substrate having a high boron concentration. Furthermore, even when the substrate having low boron concentration is used, there can be easily produced in high productivity the epitaxial silicon single crystal wafer which has a high gettering effect, a low concentration of heavy metal impurity and an excellent crystallinity.

DESCRIPTION OF THE INVENTION AND A PREFERRED EMBODIMENT

Figure 1:
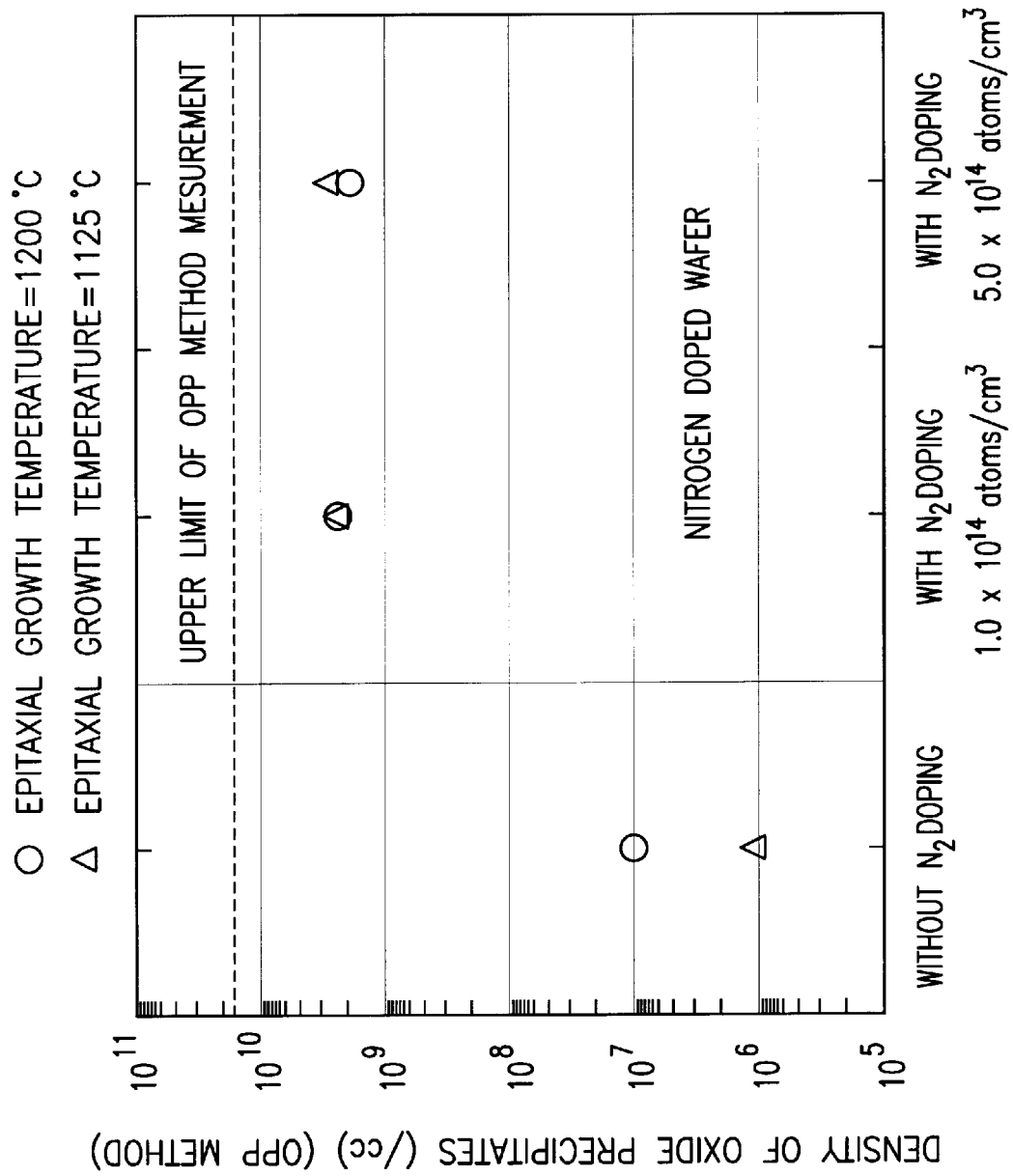
FIG. 1 is a graph showing a result of measurement of the density of oxide precipitates defects in the wafer according to OPP method after epitaxial growth followed by heat treatment for oxygen precipitation in Example 1 and Comparative Example 1.

The present invention will now be described. However, the invention is not limited thereto.

The inventors of the present invention have found that an epitaxial silicon single crystal wafer having high gettering effect, low concentration of heavy metal impurity and excellent crystallinity can be produced by using a silicon single crystal wafer with high gettering effect and high productivity obtained by a technology of doping nitrogen during growth of the silicon single crystal by CZ method as a substrate wafer for production of the epitaxial silicon single crystal, and studied various conditions, to complete the present invention.

Namely, it is indicated that doping of nitrogen in silicon single crystal promotes agglomeration of oxygen in silicon and increases the density of oxide precipitates (T. Abe and H. Takeno, Mat. Res. Soc. Symp. Proc. Vol. 262, 3, 1992). It is considered that the effect can be achieved as a result of vacancy agglomeration process is transited from homogenous nuclei formation to heterogeneous nuclei formation.

Accordingly, the silicon single crystal having high oxide precipitate density can be obtained by growing a silicon single crystal by CZ method with doping nitrogen, and thus the silicon single crystal wafer having very small crystal defect can be obtained by processing it. Moreover, when an epitaxial layer is grown on the silicon single crystal wafer as a substrate, a higher oxide precipitate density can be achieved at same oxygen concentration, compared to that achieved by using the substrate produced without doping nitrogen. As a result, an epitaxial layer having extremely low concentration of heavy metal impurity defects can be grown.

As described above, a silicon single crystal wafer produced by doping nitrogen during growth of the silicon single crystal has a high gettering capability, even though the boron concentration is low. Accordingly, when the epitaxial layer is grown on the surface of the substrate having high resistivity, it is possible to produce an epitaxial silicon wafer in which heavy metal impurity is removed by gettering. Moreover, when the epitaxial layer is grown on the surface of the substrate having low boron concentration, auto-doping is not caused, and therefore a process for preventing auto-doping is not necessary, so that productivity and cost performance can be improved.

A known method as described in Japanese Patent Application Laid-open (kokai) No. 60-251190 can be used in order to grow a silicon single crystal ingot by CZ method with doping nitrogen.

Namely, CZ method is a method wherein a seed crystal is brought into contact with a melt of polycrystalline silicon raw material contained in a quartz crucible, and pulled slowly with being rotated to grow a silicon single crystal ingot having a desired diameter. In the method, nitrogen can be doped in the pulled crystal by filling nitride in a quartz crucible in advance, or putting a nitride in a silicon melt, or pulling the crystal in an atmosphere containing nitrogen. A doping amount can be controlled by controlling an amount of nitride, or a concentration or a flowing time of nitrogen gas.

When nitrogen is doped during growth of the single crystal ingot according to CZ method as described above, growth of grown-in defect incorporated can be suppressed, and aggregation of oxygen atoms in silicon can be promoted, and density of oxide precipitates can be increased. In the method, it is not necessary to decrease a pulling rate.

Furthermore, the method can be easily conducted through use of an existing apparatus without requiring installation of any other apparat uses, and can produce a silicon single crystal in high productivity.

The reason why doping of nitrogen in silicon single crystal promotes agglomeration of oxygen in silicon and increases the density of oxide precipitates is, as described above, considered to be that oxygen atoms agglomeration process is transited from homogenous nuclei formation to heterogeneous nuclei formation wherein impurity nitrogen serves as a nucleus.

Accordingly, the concentration of nitrogen to be doped is preferably $1 \times 10^{10}$ atoms/cm$^3$ or more which is an amount that heterogeneous nuclei formation can be caused sufficiently. The density of oxide precipitates can be thereby increased sufficiently.

When the concentration of nitrogen is more than $5 \times 10^{15}$ atoms/cm$^3$ which is solid solubility of nitrogen in silicon single crystal, crystallization of silicon single crystal itself is inhibited. Accordingly, the concentration is preferably not more than the value.

Furthermore, the nitrogen concentration is preferably $1 \times 10^{13}$ to $1 \times 10^4$ atoms/cm$^3$. When the nitrogen concentration is $1 \times 10^{13}$ atoms/cm$^3$ or more, nuclei of oxygen precipitation which is stable at higher temperature can be surely formed in the as-grown state. Accordingly, even when the epitaxial growth is performed at high temperature, for example, 1000° C. or more, nuclei of oxygen precipitation are not eliminated, so that a epitaxial wafer having a density of oxide precipitates of $1 \times 10^8$ number/cm$^3$ or more after the heat treatment for oxygen precipitation can be surely produced. When the nitrogen concentration is $1 \times 10^{14}$ atoms/cm$^3$ or less, formation of crystal defects such as the stacking fault (SF) or the like on the epitaxial layer can be extremely suppressed.

Although the amount of nuclei of oxygen precipitation in the as-grown state cannot be measured directly, it can be evaluated by measuring a density of oxide precipitates after the heat treatment for oxygen precipitation.

An oxygen concentration contained in a single crystal ingot is preferably 18 ppma or less, when a silicon single crystal ingot is grown by CZ method with doping nitrogen.

When the oxygen concentration in the silicon single crystal is more than 18 ppma, defects such as oxide precipitates or the like which lowers crystallinity of the epitaxial layer are apt to be formed in the surface layer of the silicon single crystal. Accordingly, formation of oxide precipitates can be prevented when the oxygen concentration is low as described above, so that the crystallinity of the epitaxial layer is not adversely affected. In the bulk portion, oxygen precipitation is accelerated by the presence of nitrogen, so that sufficient gettering effect can be achieved even when the oxygen concentration is low.

The oxygen concentration contained in the crystal can be lowered in the above range by a conventional method, when a silicon single crystal ingot is grown. For example, the oxygen concentration can be easily controlled in the above mentioned range by reducing the number of rotation of a crucible, increasing gas volume of flowing, lowering an atmosphere pressure, controlling temperature distribution and/or convection of a silicon melt or the like.

The silicon single crystal ingot wherein nitrogen is doped in a desirable concentration, only a few crystal defects are present and oxygen is contained in a desirable concentration in CZ method can be thus obtained. After it is sliced by a general method with a slicing apparatus such as an inner diameter blade slicer, a wire saw or the like, it is subjected to processes such as chamfering, lapping, etching, polishing or the like to be a silicon single crystal wafer. Of course, such processes are merely examples, and other processes such as cleaning, heat treatment or the like can be conducted, and the process can be changed appropriately depending on the purpose, namely, order of processes can be changed, and some processes can be omitted.

It is preferable that the silicon single crystal wafer is subjected to a heat treatment of from 900° C. to a melting point of silicon before the epitaxial growth is performed. It will be possible to out-diffuse nitrogen or oxygen in the surface layer of the silicon single crystal wafer by conducting the above heat treatment before the formation of the epitaxial layer.

The out-diffusion of nitrogen is performed in order to prevent precipitation of oxygen in the area of the surface layer of the silicon single crystal where the epitaxial layer is formed, due to oxygen precipitation acceleration effect of nitrogen, and thereby prevent formation of defects which affect adversely to the crystallinity of the epitaxial layer (for example, generation of SF).

In this case, since a diffusion rate of nitrogen in silicon is quite high, nitrogen on the surface can be surely out-diffused by performing the heat treatment. Specific condition of the heat treatment is a temperature of 900° C. to a melting point of silicon, preferably a temperature of 1100° C. to 1250° C.

The heat treatment at a temperature in the above mentioned range makes it possible to out-diffuse nitrogen sufficiently in the surface layer of the silicon single crystal wafer, and to out-diffuse oxygen at the same time, so that generation of defects due to oxide precipitate in the surface layer can be prevented almost completely, and adverse influence to crystallinity of the epitaxial layer can be prevented.

When the concentration of nitrogen is low, if the above-mentioned heat treatment is not performed before the epitaxial growth and high temperature heat treatment for epitaxial growth is directly performed, nuclei of oxygen precipitation is dissolved, and precipitation is not sufficiently generated even if the heat treatment is performed after then, as a result, the gettering effect cannot be achieved in some cases. However, if the heat treatment described above is performed before the high temperature heat treatment for epitaxial growth, gettering effect can be achieved on formation of the epitaxial layer, and the epitaxial silicon single crystal wafer having quite low concentration of heavy metal impurity can be obtained.

As the heat treatment atmosphere, hydrogen gas, an inert gas such as argon gas or the like, or a mixed atmosphere thereof may be selected. Furthermore, an oxygen atmosphere may be selected in some cases. However, when the heat treatment is performed in an oxygen atmosphere, nuclei of OSF in the surface layer of the wafer may be grown under a certain condition of the heat treatment, or an oxide film may be formed on the surface. When the oxide film is formed on the surface, the step for removing the oxide film is necessary. Accordingly, it is preferable to use an atmosphere such as hydrogen, argon or the like in which the film is not formed.

As an apparatus for the heat treatment, when the heat treatment is performed for a relatively short time as 5 minutes or less, there can be used a rapid heating/rapid cooling apparatus using, for example, a lamp heating type apparatus which is known as RTA (Rapid Thermal Annealing) apparatus or an epitaxial growth apparatus to conduct the heat treatment and epitaxial growth successively, and thereby high productivity is achieved. When the heat treatment is performed for a relatively long time, batchwise heat treatment is efficiently performed using a heat treatment furnace which is heated by a heater, and can subject dozens or more of wafers to the heat treatment.

According to the present invention, a substrate with a low boron concentration having a resistivity of 10Ω·cm can be used as a substrate for epitaxial silicon single crystal wafer instead of a substrate with a high boron concentration. In such a substrate having low boron concentration, there is not caused a problem of auto-doping, and therefore, it is not necessary to perform the treatment such as CVD coating of the back surface of the substrate with $SiO_2$ or the like. Accordingly, productivity and cost performance can be improved.

In the bulk portion of the silicon single crystal wafer, oxygen precipitation is accelerated due to presence of nitrogen, so that high gettering effect can be achieved. Even when the silicon single crystal wafer having low boron concentration is used, sufficient gettering effect can be achieved. Accordingly, the epitaxial layer having little heavy metal impurity defects can be formed on the substrate having high resistivity.

EXAMPLE

The following examples and comparative examples are being submitted to further explain the present invention. These examples are not intended to limit the scope of the present invention.

Example 1, Comparative Example 1

In accordance with CZ method, polycrystalline silicon raw material to which boron was added in a predetermined amount was charged into a quartz crucible having a diameter of 18 inches, six silicon single crystal ingots of p-type having a diameter of 6 inches and orientation <100> were pulled at a pulling rate of 1.0 mm/min which is a general pulling rate. Four of them were pulled while a wafer with a silicon nitride film is previously charged raw material. Other two of them were pulled without doping nitrogen. The number of rotation of the crucible was controlled so that oxygen concentration in the single crystal may be 16 ppma (JEIDA) when pulling any of them.

Nitrogen concentration in the tail part of each of two of the four crystal ingots in which nitrogen was doped as measured with FT-IR was $1.0 \times 10^{14}$ atoms/cm$^3$ on the average, and nitrogen concentration as for the other two ingots was $5.0 \times 10^{14}$ atoms/cm$^3$ on the average (segregation coefficient of nitrogen is very small, concentration in the straight body of the crystal ingot will be lower than the value). Oxygen concentration of all crystal ingots as measured with FT-IR was 16 ppma in all of the six single crystal ingots.

The wafers were sliced from the six single crystal ingots thus obtained with a wire saw, and subjected to chamfering, lapping, etching, and mirror polishing. All of them were produced in almost the same condition except that nitrogen is doped or not and the doping amount thereof. Three kinds of six silicon single crystal mirror polished wafers having a diameter of 6 inches were produced. The resistivity of the six silicon single crystal wafer was measured. All of them have resistivity of 10Ω·cm.

The six as grown silicon single crystal wafers thus obtained having the three steps of the nitrogen doping amount were subjected to the heat treatment. An epitaxial layer having thickness of 5 μm was grown each at 1200° C. on one of two silicon wafer having the same nitrogen doping amount, and at 1125° C. on the other of them. The furnace for epitaxial growth consists of a cylinder type belljar and a susceptor placed therein on which a silicon substrate is mounted. Heating was performed in a radiation heat method. Epitaxial layer was formed on the silicon wafer by introducing $SiHCl_3+H_2$ therein.

All of the silicon single crystal wafers were subjected to the heat treatment at 800° C. in an atmosphere of nitrogen for 4 hours, and then the heat treatment at 1000° C. for 16 hours in $O_2$ gas atmosphere to precipitate oxide precipitates. The gettering effect of each of the resultant epitaxial silicon single crystal wafers was then evaluated by means of a density of the oxide precipitates in the bulk portion of the silicon wafers.

The density of the oxide precipitates was measured by OPP (Optical Precipitate Profiler) method. The OPP method is an applied method of Normalski type differential interference microscope. In the method, laser beam from light source is separated to two orthogonal polarized straight beams of which phases are 90 degree different from each other through use of a polarizing prism, which then enter the wafer from the side of mirror polished surface. At this time, when one of the beams crosses a defect, phase shift occurs to form phase contrast with the other beam. The defect is detected by detecting the phase contrast with a polarization analyzer after the beams transmit from the back surface of the wafer.

The results thus obtained are shown in FIG. 1. In FIG. 1, the density of oxide precipitate defect of the wafer treated without doping nitrogen, with doping nitrogen at a doping amount of $1.0 \times 10^{14}$ atoms/cm$^3$, with doping nitrogen at a doping amount of $5.0 \times 10^4$ atoms/cm$^3$ were shown from the left. The circular plots show the density of oxide precipitate defect when the epitaxial growth was performed at 1200° C., the triangle plots show the density of oxide precipitate defect when the epitaxial growth was performed at 1125° C.

As shown in FIG. 1, high density of the oxide precipitates could be achieved either at an nitrogen doping amount of $1.0 \times 10^{14}$ atms/cm$^3$ or at $5.0 \times 10^{14}$ atoms/cm$^3$, regardless of the temperature during epitaxial growth, namely, high gettering effect could be achieved. When nitrogen was not doped, density of the oxide precipitates was low, and gettering effect was small in each case.

In other words, nuclei of oxygen precipitation which are present in the as-grown state are not eliminated in the wafer in which nitrogen is doped, even when high temperature epitaxial growth at 1100° C. or more was performed, so that there can be surely produced the epitaxial wafer in which high density of oxide precipitate can be formed by the heat treatment for oxygen precipitation.

Example 2, Comparative Example 2

In accordance with CZ method, in a similar way to the method of Example 1, silicon single crystal ingots of p-type (boron doped) having a diameter of 8 inches and orientation <100> were pulled at a pulling rate of 1.0 mm/min and 1.8 mm/min. They were pulled with controlling the amount of a wafer with a silicon nitride film previously charged so that nitrogen concentration may be $5 \times 10^{12}$, $5 \times 10^{13}$, $1 \times 10^{15}$, $5 \times 10^{14}$ atoms/cm$^3$. In Comparative Example, the single crystal ingot was pulled at 1.0 mm/min without doping nitrogen. The silicon single crystal mirror wafer having various nitrogen concentration were produced from the resultant single crystal ingots having various nitrogen concentration. Any of the resultant silicon single crystal mirror wafer had resistivity of about 10Ω·cm and oxygen concentration of 10.5 to 17.5 ppma (JEIDA).

Then, hydrogen bake was performed at 1150° C. for one minute, followed by silicon epitaxial growth at 1170° C. to form an epitaxial layer having thickness of 3 µm.

The heat treatment for oxygen precipitation and measurement of density of the oxide precipitates were performed in the same method as that of Example 1. The results are shown in FIG. 2.

Figure 2:
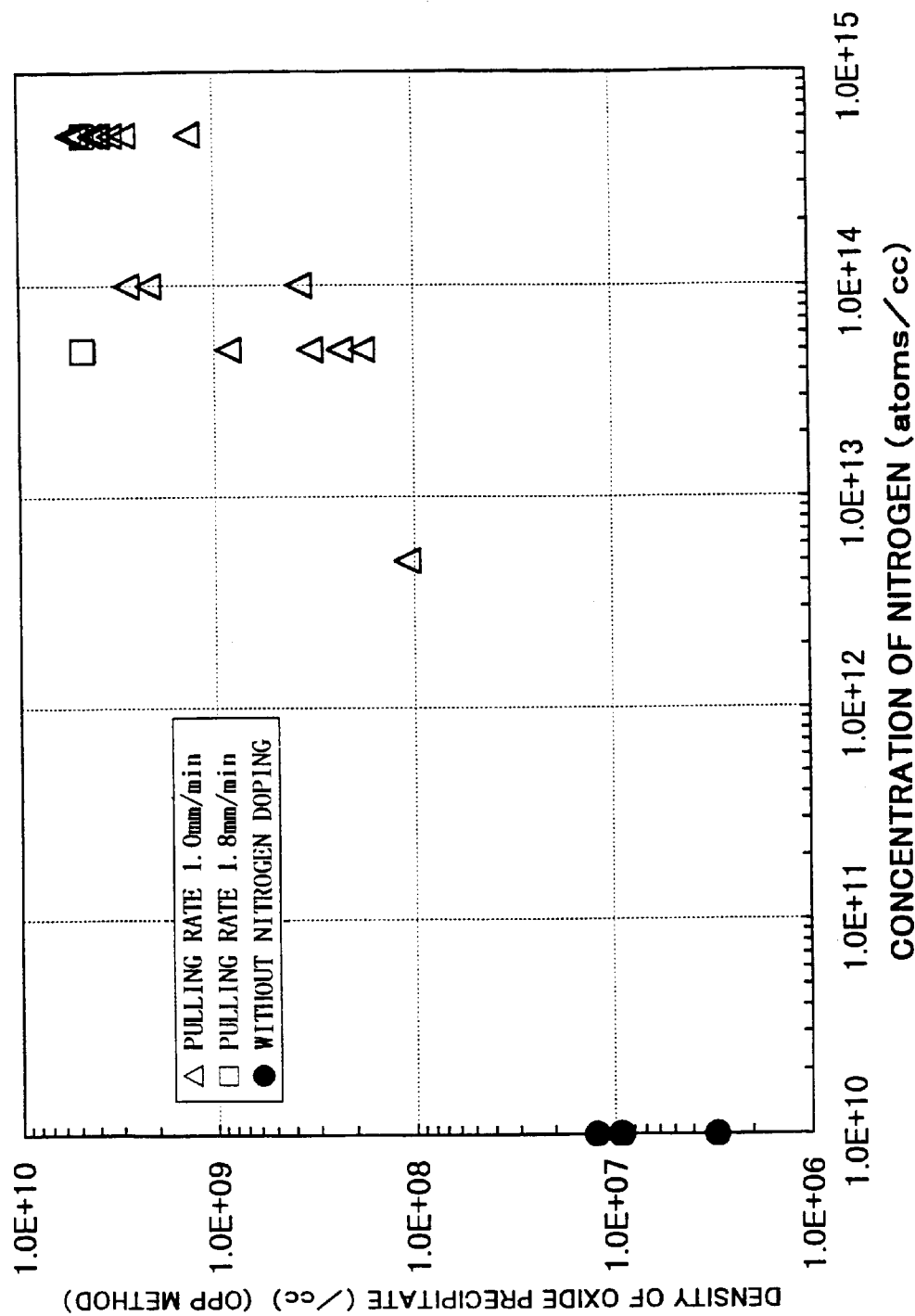
FIG. 2 is a graph showing a result of measurement of the density of oxide precipitates defects in the wafer according to OPP method after epitaxial growth followed by heat treatment for oxygen precipitation in Example 2 and Comparative Example 2.

As shown in FIG. 2, nuclei of oxygen precipitation which are present in the as-grown state are not eliminated in the wafer in which nitrogen is doped, even when high temperature epitaxial growth at 1000 ° C. or more, and oxide precipitates were surely formed by heat treatment for oxygen precipitation as Example 1. In the figure, "1.0E+10" means $1.0 \times 10^{10}$.

Example 3

In accordance with CZ method, in a similar way to the method of Example 1, silicon single crystal ingots of p-type (boron doped) having a diameter of 8 inches and orientation <100> were pulled at a pulling rate of 1.0 mm/min and 1.8 mm/min. They were pulled with controlling the amount of a wafer with a silicon nitride film previously charged so that nitrogen concentration may be $1 \times 10^{13}$ to about $1 \times 10^{15}$ atoms/cm$^3$. The silicon single crystal mirror wafers having various nitrogen concentration were produced from the resultant single crystal ingots having various nitrogen concentration. Any of the resultant silicon single crystal mirror wafer had resistivity of about 10Ω·cm and oxygen concentration of 10 to 18 ppma (JEIDA).

Then, hydrogen bake was performed at 1130° C. for one minute, followed by silicon epitaxial growth at 1090° C. to form an epitaxial layer having thickness of 15 µm.

Figure 3:
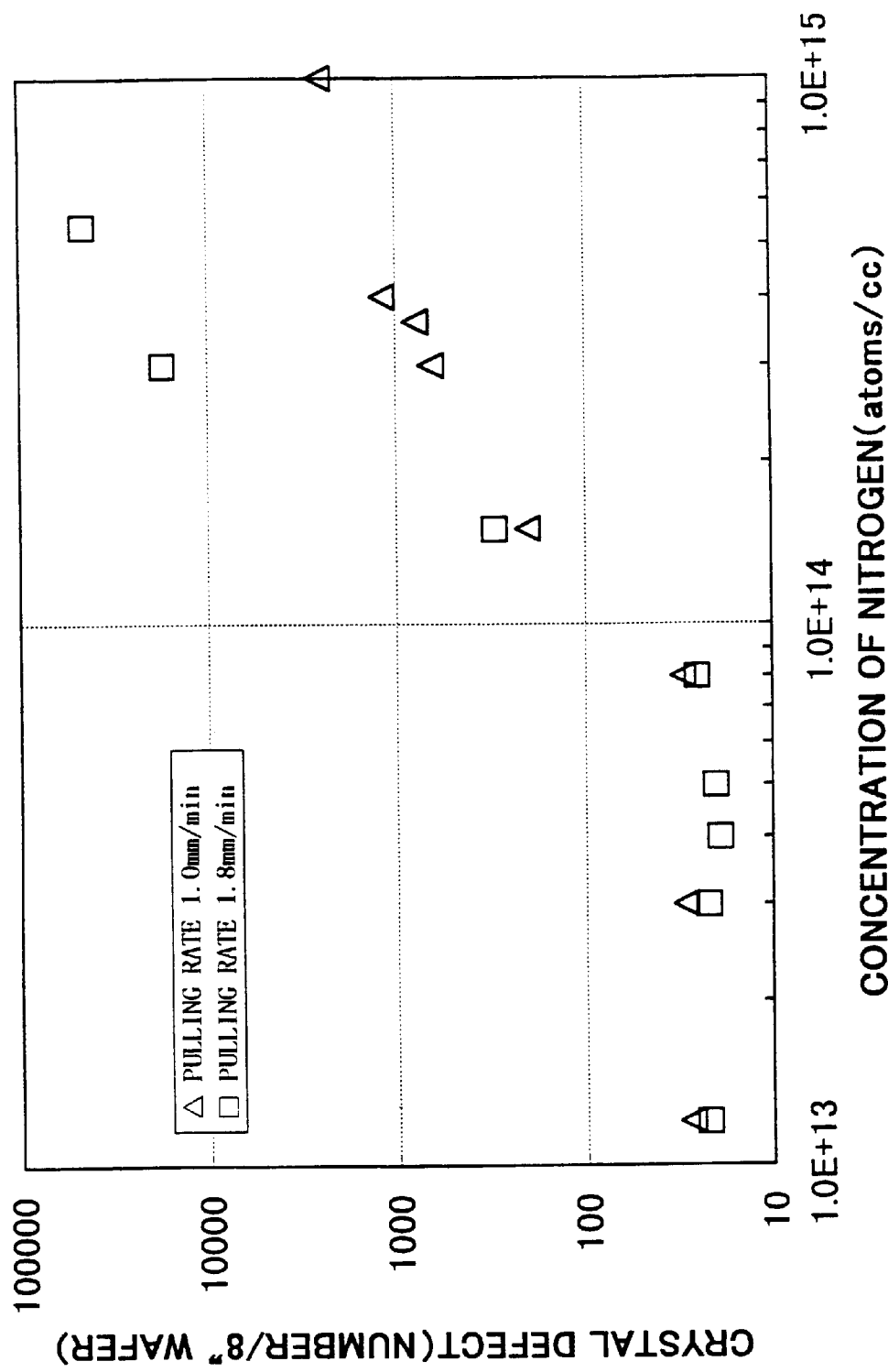
FIG. 3 is a graph showing a result of measurement of crystal defects on the surface after epitaxial growth in Example 3.

The density of crystal defects such as stacking faults (SF) on the surface after the epitaxial growth was measured with SP1 (bland name, manufactured by KLA TENCOR CORPORATION). The results were shown in FIG. 3.

The epitaxial wafers were then subjected to the heat treatment for oxygen precipitation and the density of the oxide precipitates was measured in the same way as Example 1. It was found that any of the wafers had the density of the oxide precipitates of $1 \times 10^8$ number/cm$^3$ or more.

It was found from these results that when the nitrogen concentration is $1 \times 10^{13}$ to $1 \times 10^{14}$ atoms/cm$^3$, the silicon epitaxial wafer wherein the number of crystal defects on the epitaxial layer on the 8 inch wafer was 100 number or less, which corresponds to a defect density of about 0.3 number/cm$^2$ and a density of the oxide precipitates is $1 \times 10^8$ number/cm$^3$ can be surely obtained.

Example 4

In accordance with CZ method, in a similar way to the method of Example 1, silicon single crystal ingots of p-type (boron doped) having a diameter of 6 inches and orientation <100> were pulled at a pulling rate of 1.0 mm/min. They were pulled with controlling the amount of a wafer with a silicon nitride film previously charged so that nitrogen concentration may be about $5 \times 10^4$ atoms/cm$^3$. Any of the resultant silicon single crystal mirror wafer had resistivity of about 10Ω·cm and oxygen concentration of 16 ppma (JEIDA).

Then, the heat treatment before epitaxial growth was performed through use of SHS-2800 manufactured by Steag Microtech International corporation, RTA (Rapid Thermal Annealing) apparatus which is a lamp heating type apparatus. The heat treatment was performed at 1200° C. for 0 to 3600 seconds in an atmosphere of 25% of $H_2$ and 75% of Ar. When the heat treatment was performed for more than 60 seconds, it was performed in such way that the heat treatment for 60 seconds was performed repeatedly until sum of the period reaches a predetermined value.

Figure 4:
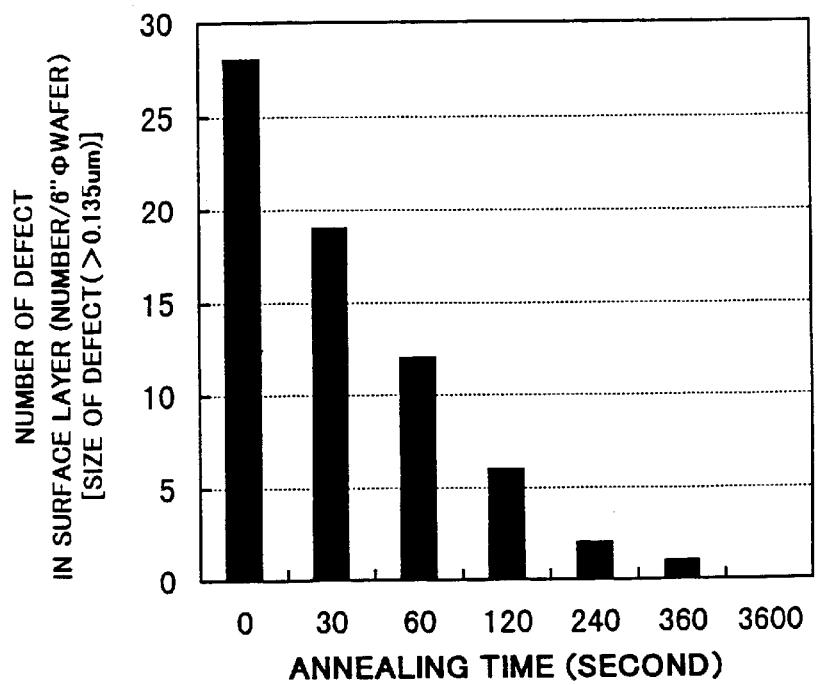
FIG. 4 is a graph showing a result of measurement of the number of defects on the surface of the wafer before and after heat treatment that is performed before epitaxial growth in Example 4.
Figure 5:
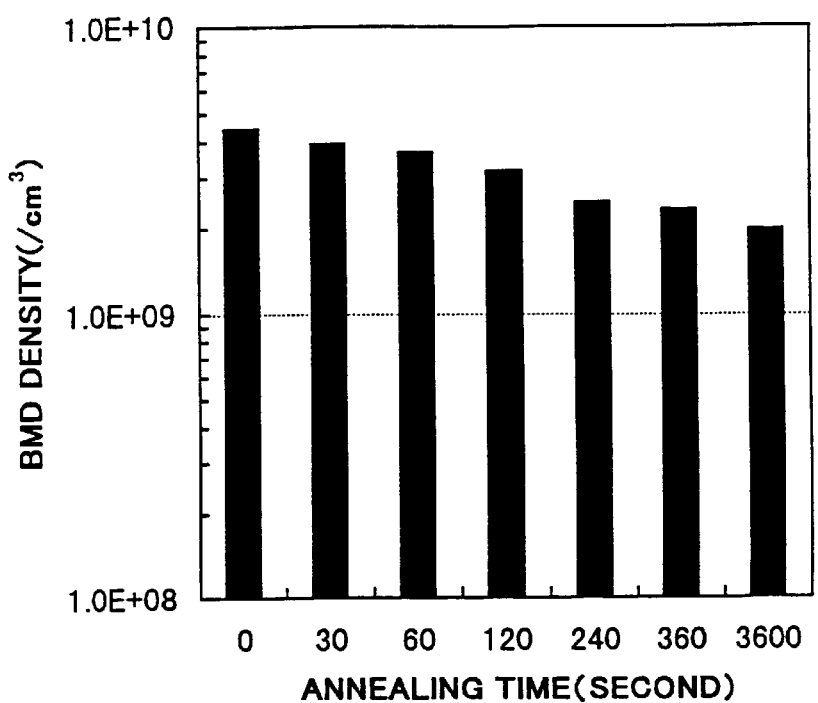
FIG. 5 is a graph showing a result of measurement of the defect density in the bulk portion of the wafer before and after heat treatment that is performed before epitaxial growth in Example 4.

The number of defects on the surface of the wafer before and after the heat tretment (a defect size of 0.135 µm or more) was determined through use of HITACHI SEI-SAKUSHO OSDA (Optical Shallow Defect Analyzer), and shown in FIG. 4. The wafer before epitaxial growth was subjected to the heat treatment for oxygen precipitation in the same manner as Example 1. The density of the defects in a bulk portion of the wafer at a depth of 30 µm was determined through use of non destructive inspection apparatus OPP (Optical Precipitate Profiler) manufactured by Bio-Rad corporation, and the results were shown in FIG. 5. It is apparent from the results shown in FIG. 4 and FIG. 5 that the defects in the surface layer can be surely decreased by the anneal treatment for 30 seconds or more. There is caused no significant difference in BMD density which contributes to gettering effect. Namely, by the heat treatment before the epitaxial growth, there can be produced the wafer wherein the size of defects in the surface layer portion is 0.135 µm or more, the number of defects in 6 inch wafer is 20 or less, and the density of defects is about 0.12 number/cm$^2$ or less, and density of the oxide precipitates formed by the heat treatment for oxygen precipitation is $1 \times 10^8$ number/cm$^3$ or more.

Then, hydrogen bake was performed at 1130° C. for one minute, followed by silicon epitaxial growth at 1090° C. to form an epitaxial layer having thickness of 15 µm. The oxide dielectric breakdown voltage characteristics (TZDB property and TDDB property) were then measured. The results were shown in FIGS. 6 and 7.

Figure 6:
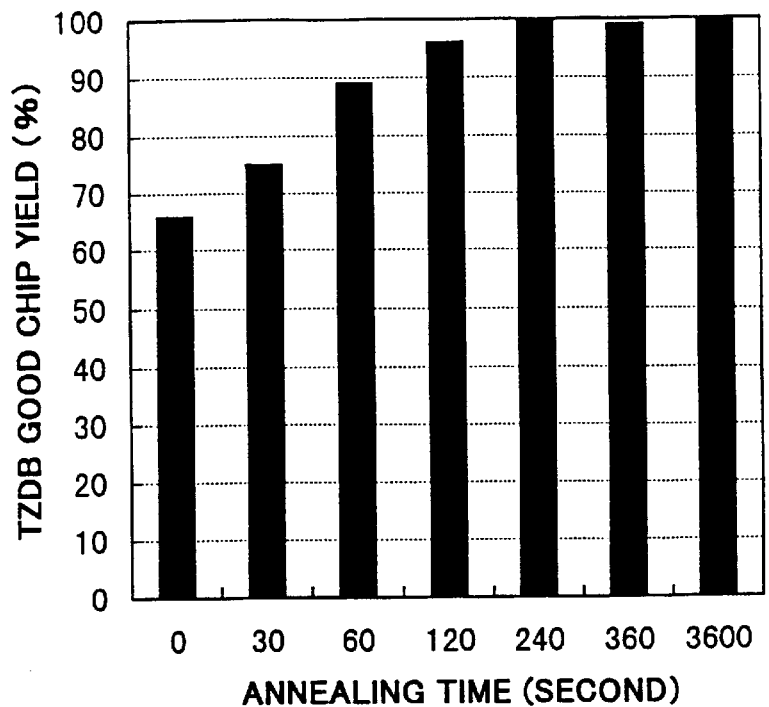
FIG. 6 is a graph showing a result of measurement of good chip yield of TZDB in the wafer after epitaxial growth in Example 4.

The good chip yield of TZDB (Time Zero Dielectric Breakdown) shown in FIG. 6 was a yield of the article having a oxide dielectric breakdown voltage of 8 MV/cm or more as measured at a gate oxide film thickness of 25 nm, a gate area of 8 mm$^2$, current density in decision of 0.01 mA/cm$^2$, and at a room temperature.

Figure 7:
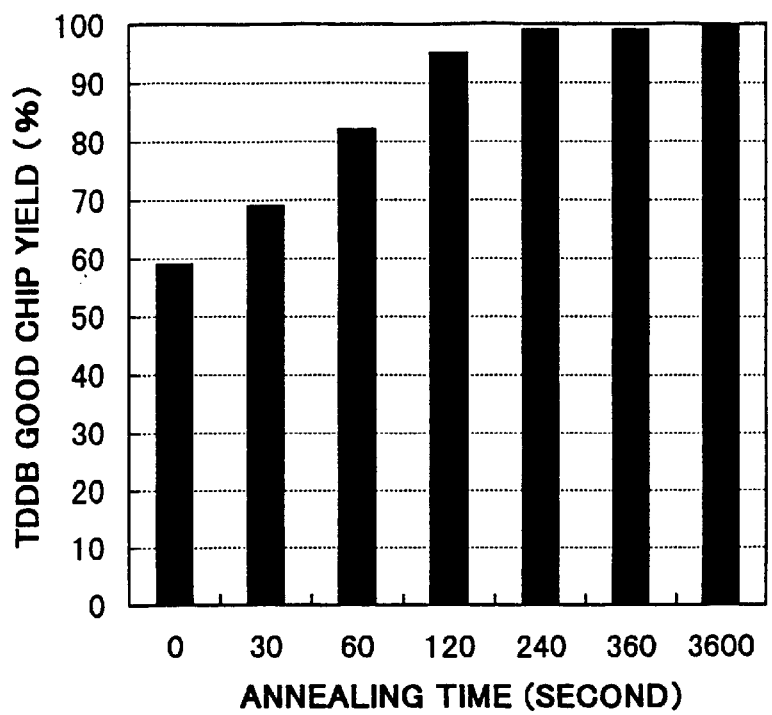
FIG. 7 is a graph showing a result of measurement of good chip yield of TDDB in the wafer after epitaxial growth in Example 4.

The good chip yield of TDDB (Time Dependent Dielectric Breakdown) shown in FIG. 7 was a yield of the article having a oxide dielectric breakdown voltage of 25 C/cm$^2$ or more as measured at a gate oxide film thickness of 25 nm, a gate area of 4 mm$^2$, sending stress electric current of 0.01 mA/cm$^2$, and at a room temperature.

It is apparent from the results shown in FIG. 6 and FIG. 7 that the good chip yield can be surely improved at time of the heat treatment before the epitaxial growth of 30 seconds or more, and the good chip yield is 95% or more at the heat treatment time of 120 seconds or more.

The present invention is not limited to the above-described embodiment. The above-described embodiment is a mere example, and those having the substantially same structure as that described in the appended claims and providing the similar action and effects are included in the scope of the present invention.

For example, when the silicon single crystal ingot in which nitrogen is doped is grown according to the present invention by Czochralski method, a magnetic field may be applied or not. The term of Czochralski method also means not only general Czochralski method, but also so-called MCZ method.

Furthermore, the present invention can be applied to not only a method wherein epitaxial growth is conducted by CVD, but also a method wherein epitaxial growth is conducted by MBE (Molecular Beam Epitaxy) to produce an epitaxial silicon single crystal wafer.

What is claimed is:

1. A method for producing an epitaxial silicon single crystal wafer wherein a silicon single crystal ingot in which nitrogen is doped is grown by Czochralski method, and the resultant silicon single crystal ingot is sliced to produce a silicon single crystal wafer, and then an epitaxial layer is formed in the surface layer portion of the resultant silicon single crystal wafer.

2. The method for producing an epitaxial silicon single crystal wafer according to claim 1 wherein a concentration of nitrogen doped in the single crystal ingot is in the range of $1\times10^{10}$ to $5\times10^{15}$ atoms/cm$^3$ when the silicon single crystal in which nitrogen is doped is grown by Czochralski method.

3. The method for producing an epitaxial silicon single crystal wafer according to claim 1 wherein a concentration of nitrogen doped in the single crystal ingot is in the range of $1\times10^{13}$ to $1\times10^{14}$ atoms/cm$^3$ when the silicon single crystal in which nitrogen is doped is grown by Czochralski method.

4. The method for producing an epitaxial silicon single crystal wafer according to claim 1 wherein an interstitial oxygen concentration contained in the single crystal ingot is 18 ppma or less when the silicon single crystal in which nitrogen is doped is grown by Czochralski method.

5. The method for producing an epitaxial silicon single crystal wafer according to claim 1 wherein the silicon single crystal wafer is subjected to the heat treatment of from 900° C. to a melting point of silicon before the epitaxial layer is formed in the surface layer portion of the silicon single crystal wafer.

6. The method for producing an epitaxial silicon single crystal wafer according to claim 5 wherein the heat treatment is performed in an atmosphere of hydrogen, inert gas or a mixed atmosphere thereof, for at least 30 seconds.

7. The method for producing an epitaxial silicon single crystal wafer according to claim 1 wherein a resistivity of the silicon single crystal wafer is 0.1Ω·cm or more.

8. An epitaxial silicon single crystal wafer produced by a method according to claim 1.

9. An epitaxial silicon single crystal wafer which is obtained by forming an epitaxial layer in a surface layer portion of the silicon single crystal wafer manufactured by slicing a silicon single crystal ingot grown by Czochralski method with doping nitrogen.

10. The epitaxial silicon single crystal wafer according to claim 9 wherein a nitrogen concentration is $1\times10^{10}$ to $5\times10^{15}$ atoms/cm$^3$.

11. The epitaxial silicon single crystal wafer according to claim 9 wherein a nitrogen concentration is $1\times10^{13}$ to $1\times10^{14}$ atoms/cm$^3$.

12. The epitaxial silicon single crystal wafer according to claim 11 wherein a defect density on the surface of the epitaxial layer is 0.3 number/cm$^2$ or less.

13. The epitaxial silicon single crystal wafer according to claim 9 wherein an interstitial oxygen concentration contained in the single crystal ingot is 18 ppma or less when the silicon single crystal in which nitrogen is doped is grown by Czochralski method.

14. The epitaxial silicon single crystal wafer according to claim 11 wherein an interstitial oxygen concentration contained in the single crystal ingot is 18 ppma or less when the silicon single crystal in which nitrogen is doped is grown by Czochralski method.

15. The epitaxial silicon single crystal wafer according to claim 12 wherein an interstitial oxygen concentration contained in the single crystal ingot is 18 ppma or less when the silicon single crystal in which nitrogen is doped is grown by Czochralski method.

16. The epitaxial silicon single crystal wafer according to claim 9 wherein the silicon single crystal wafer contains the nuclei of the oxygen precipitation in the as-grown silicon single crystal ingot in such an amount that the density of oxide precipitates formed by the heat treatment for oxygen precipitation after epitaxial growth is $1\times10^8$ number/cm$^3$ or more.

17. The epitaxial silicon single crystal wafer according to claim 12 wherein the silicon single crystal wafer contains the nuclei of the oxygen precipitation in the as-grown silicon single crystal ingot in such an amount that the density of oxide precipitates formed by the heat treatment for oxygen precipitation after epitaxial growth is $1\times10^8$ number/cm$^3$ or more.

18. The epitaxial silicon single crystal wafer according to claim 13 wherein the silicon single crystal wafer contains the nuclei of the oxygen precipitation in the as-grown silicon single crystal ingot in such an amount that the density of oxide precipitates formed by the heat treatment for oxygen precipitation after epitaxial growth is $1\times10^8$ number/cm$^3$ or more.

19. The epitaxial silicon single crystal wafer according to claim 9 wherein the silicon single crystal wafer is subjected to the heat treatment at a temperature in the range of from 900° C. to a melting point of silicon before the epitaxial layer is formed in the surface layer portion thereof.

20. The epitaxial silicon single crystal wafer according to claim 9 wherein the silicon single crystal wafer is subjected to the heat treatment in an atmosphere of hydrogen, inert gas or a mixed atmosphere thereof, for at least 30 seconds before the formation of the epitaxial layer on the surface layer portion.

21. The epitaxial silicon single crystal wafer according to claim 19 wherein, in the silicon single crystal wafer after the heat treat performed before epitaxial growth in the surface layer portion, the density of the defect having a size of 0.135 μm or more in the surface layer is 0.12 number/cm$^2$ or less, and the density of the oxide precipitates generated by the heat treatment for oxygen precipitation is $1\times10^8$ number/cm$^2$ or more.

22. The epitaxial silicon single crystal wafer according to claim 20 wherein, in the silicon single crystal wafer after the heat treat performed before epitaxial growth in the surface layer portion, the density of the defect having a size of 0.135 μm or more in the surface layer is 0.12 number/cm$^2$ or less, and the density of the oxide precipitates generated by the heat treatment for oxygen precipitation is $1\times10^8$ number/cm$^2$ or more.

23. The epitaxial silicon single crystal wafer according to claim 9 wherein a resistivity of the silicon single crystal wafer is 0.1Ω·cm or more.

24. The epitaxial silicon single crystal wafer according to claim 22 wherein a resistivity of the silicon single crystal wafer is 0.1Ω·cm or more.

* * * * *